US011200961B1

(12) United States Patent
Uribe

(10) Patent No.: US 11,200,961 B1
(45) Date of Patent: Dec. 14, 2021

(54) APPARATUS, SYSTEM AND METHOD TO LOG MEMORY COMMANDS AND ASSOCIATED ADDRESSES OF A MEMORY ARRAY

(71) Applicant: Intel Corporation, Santa Clara, CA (US)

(72) Inventor: Sebastian T. Uribe, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/946,528

(22) Filed: Jun. 25, 2020

(51) Int. Cl.
| | |
|---|---|
| *G11C 29/44* | (2006.01) |
| *G11C 29/18* | (2006.01) |
| *G11C 29/14* | (2006.01) |
| *G11C 29/12* | (2006.01) |

(52) U.S. Cl.
CPC ........ *G11C 29/44* (2013.01); *G11C 29/12015* (2013.01); *G11C 29/14* (2013.01); *G11C 29/18* (2013.01)

(58) Field of Classification Search
CPC ... G11C 29/44; G11C 29/12015; G11C 29/18; G11C 29/14
See application file for complete search history.

(56) References Cited

U.S. PATENT DOCUMENTS

2021/0019218 A1\* 1/2021 Zhu ..................... G06F 11/0778

\* cited by examiner

*Primary Examiner* — Tri M Hoang
(74) *Attorney, Agent, or Firm* — Alliance IP, LLC

(57) ABSTRACT

A method, apparatus and system. The method includes: storing, in a memory circuitry, information on memory commands and associated addresses, the memory commands including read and write commands corresponding to associated addresses within memory chips of a storage device; in response to a determination of a read failure corresponding to at least one of the memory commands: performing a read operation on the information from the memory circuitry; and causing the information to be sent to a host of a computer system that includes the storage device, the information adapted to be used to implement a memory debugging operation for the memory chips.

18 Claims, 7 Drawing Sheets

APPARATUS, SYSTEM AND METHOD TO LOG MEMORY COMMANDS AND ASSOCIATED ADDRESSES OF A MEMORY ARRAY

FIELD

The present disclosure relates in general to the field of computer development, and more specifically, to debugging operations for memory and storage devices.

BACKGROUND

A storage device may include non-volatile memory, such as multi-stack three dimensional (3D) crosspoint memory cells or arrays. Some system level failures of non-volatile memories are difficult to debug because of the difficulty of obtaining an accurate history of system logs of the device under test (DUT). Although firmware or hardware solutions have been proposed to keep track of system logs, such solutions typically require each memory system to develop its own unique debug solution. In addition, although bus or logic analyzers have been used to record system logs for the DUT, some system dies may not be physically reachable by an analyzer. Moreover, an analyzer may interfere with a failure occurrence from actually taking place.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
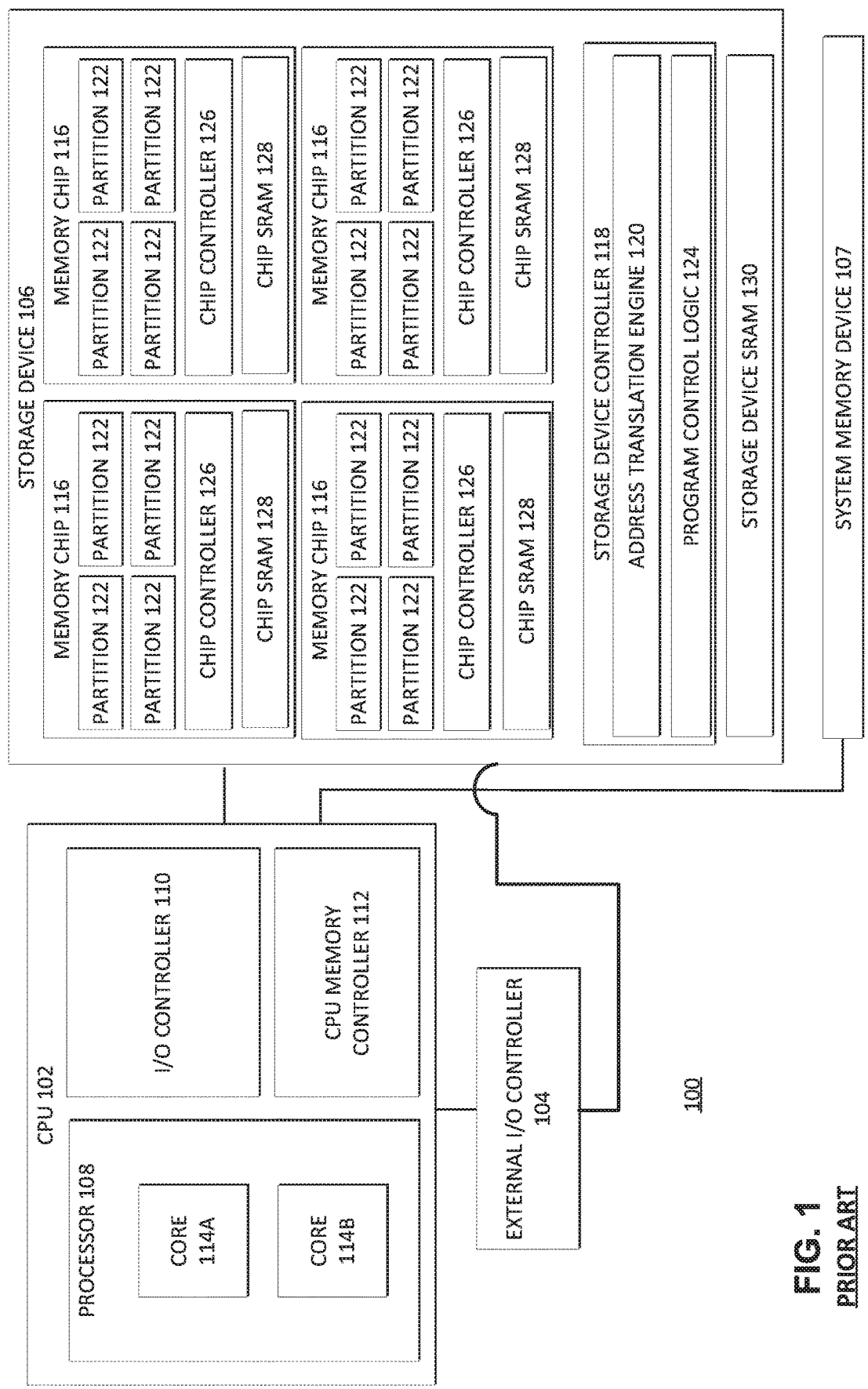
FIG. 1 illustrates a block diagram of components of a computer system of the prior art.

FIG. 1 illustrates a block diagram of components of a computer system 100 in accordance with the prior art. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition may include a 3D crosspoint memory array. In some embodiments, a 3D crosspoint memory array may comprise a transistor-less (i.e., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a DSP, a network processor, a handheld processor, an application processor, a co-processor, an SOC, or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that maintains its state even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory module may include non-volatile memory and/or volatile memory.

Non-volatile memory is a storage medium that does not require power to maintain the state of data stored by the medium. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to the memory chips 116, and provide data associated with the requests to CPU 102 (e.g., via CPU memory controller 112 or I/O controller 110). Controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM 130 and chip SRAM 128 each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM 130 (such as a NVM—not shown) such that the logic may be executed by the storage device controller 118 which will have access to the logic instructions by way of the associated SRAM 128. Similarly, the logic to be implemented by the chip controller 126, upon the issuance of a command, for example from the host or CPU 102 to execute the logic, may be moved from a memory storage the logic to the associated SRAM 128 (such as a NVM—not shown) such that the logic may be executed by the associated chip controller 126 which will have access to the logic instructions by way of the associated SRAM 128.

Figure 2:
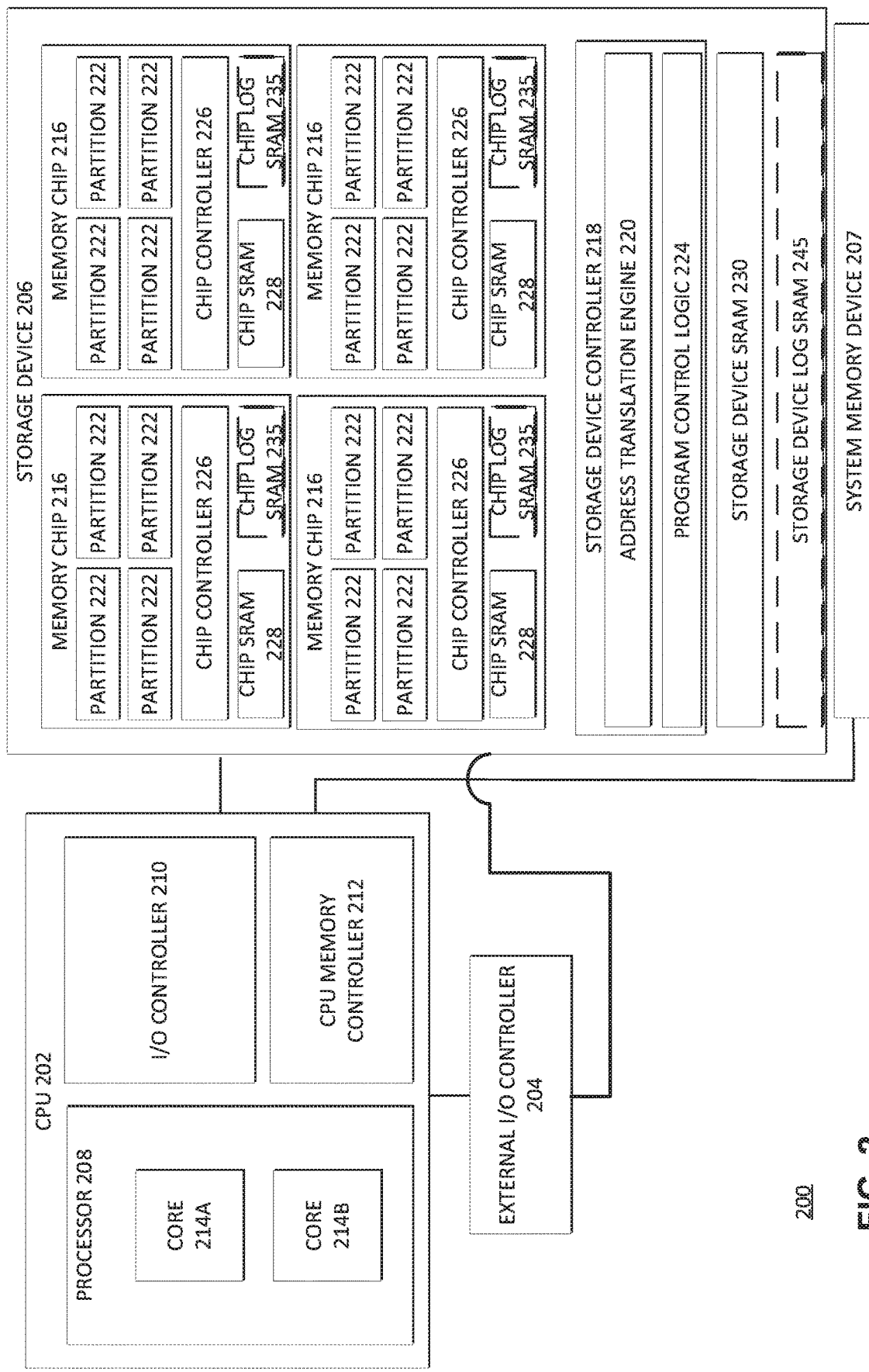
FIG. 2 illustrates a block diagram of components of a computer system according to some embodiments.

FIG. 2 illustrates a block diagram of components of a computer system 200 in accordance with certain embodiments. The computer system 200 is similar to the computer system 100 of FIG. 1, except for the provision of dedicated chip debug SRAMs 235 within each memory chip 216 and a dedicated storage device debug SRAM 245 for the storage device 206 as shown. As a result, like components in FIG. 2 are indicated by reference numerals similar to those used in FIG. 1. Hence, the same descriptions as those provided above to processor 108, cores 114A and 114B, I/O controller 110, CPU memory controller 112, external I/O controller 104, storage device 106, memory chips 116, partitions 122, chip controllers 126, chip SRAMs 128, storage device controller 118, address translation engine 120, program control logic 124, storage device SRAM 130, and system memory device 107 may be applied, respectively (except for any functionality relating to the logging of memory commands and associated addresses (i.e. memory array addresses corresponding to the memory commands) in the dedicated SRAMs 235 and 245 to be described further below) to the processor 208, cores 214A and 214B, I/O controller 210, CPU memory controller 212, external I/O controller 204, storage device 206, memory chips 216, partitions 222, chip controllers 226, chip SRAMs 228, storage device controller 218, address translation engine 220, program control logic 224, storage device SRAM 230, and system memory device 207 of FIG. 2, and will not be repeated.

Figure 3:
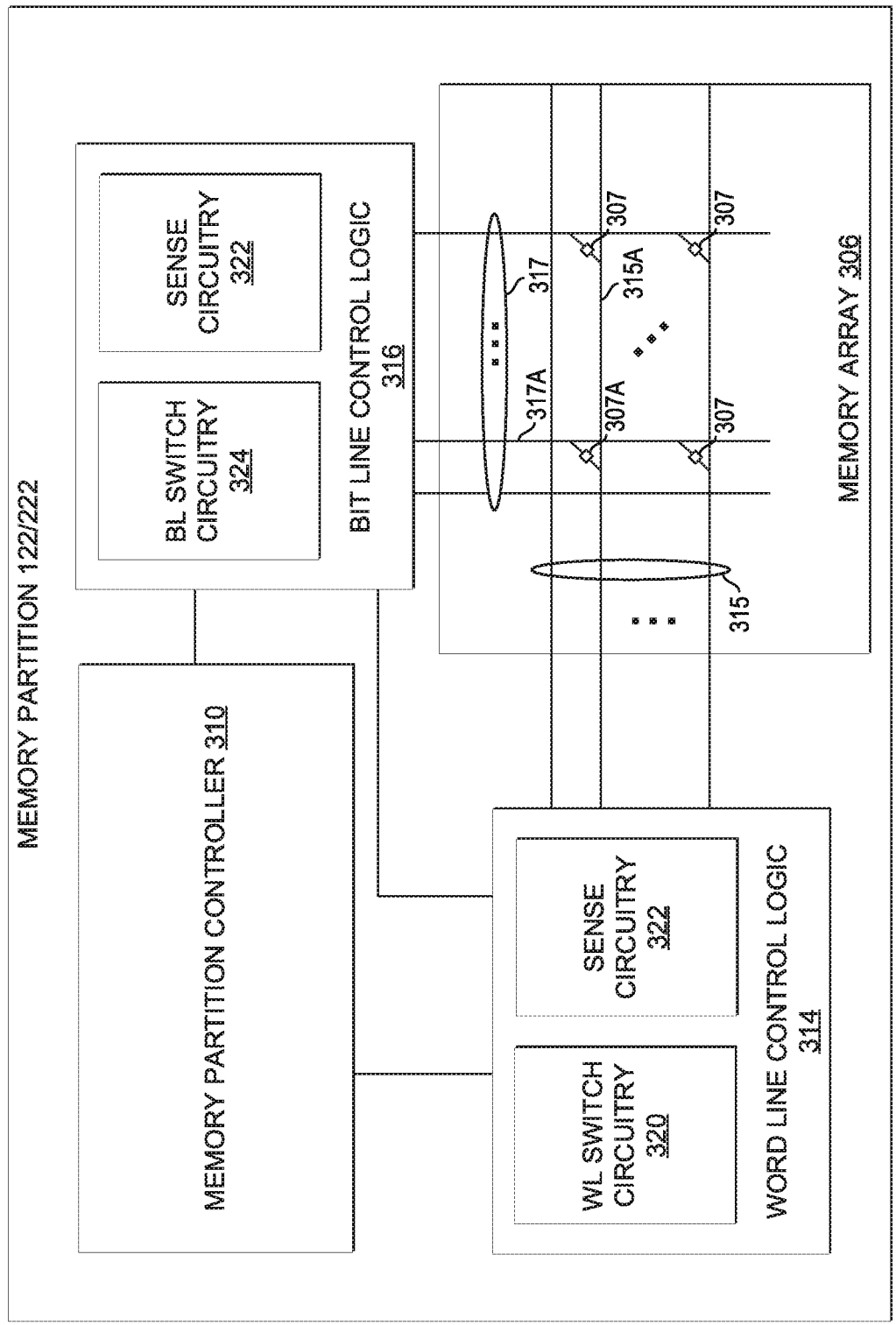
FIG. 3 illustrates a memory partition in accordance with certain embodiments.

FIG. 3 illustrates a detailed exemplary view of the memory partition 122/222 of FIG. 1/FIG. 2 in accordance with certain embodiments. In one embodiment, a memory partition 122/222 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 307 (e.g., a phase change memory cell) that also includes a selector, i.e., a select device coupled to the memory element. The select devices are configured to facilitate combining a plurality of memory elements into an array.

In some embodiments, a 3D crosspoint memory array 306 may comprise a transistor-less (i.e., at least with respect to the data storage elements of the memory) stackable crosspoint architecture in which memory cells 307 sit at the intersection of row address lines and column address lines arranged in a grid. The row address lines 315 and column address lines 317, called word lines (WLs) and bit lines (BLs), respectively, cross in the formation of the grid and each memory cell 307 is coupled between a WL and a BL where the WL and BL cross (i.e., crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

During a programming operation (i.e., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a first time period sufficient to cause the memory element to "snap back" and then maintained for a second time period to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage (a demarcation read voltage (VDM)) across the memory element is configured to be greater than a maximum set voltage and less than a minimum reset voltage for the memory element. In a particular embodiment, a voltage of the WL (V(WL)) at the cell may go down and a voltage of the BL (i.e., V(BL)) at the cell may be pulled up such that V(BL)-V(WL) is equal to a total bias on the 3D crosspoint cell (i.e., the VDM).

In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bit-line electrode of the 3D crosspoint cell may be a positive regulated node and the word-line electrode coupled to the cell may supply the bias for VDM.

In the embodiment of FIG. 3, a memory partition 122/222 includes memory partition controller 310, word line control logic 314, bit line control logic 316, and memory array 306. A host device (e.g., CPU 102/202) may provide read and/or write commands including memory address(es) and/or associated data to memory partition 122/222 (e.g., via storage device controller 118/218 and chip controller 126/226) and may receive read data from memory partition 122/222 (e.g., via the chip controller 126/226 and storage device controller 118/218). Similarly, storage device controller 118/218 may provide host-initiated read and write commands or device-initiated read and write commands including memory addresses to memory partition 122/222 (e.g., via chip controller 126/226). Memory partition controller 310 (in conjunction with word line control logic 314 and bit line control logic 316) is configured to perform memory access operations, e.g., reading one or more target memory cells and/or writing to one or more target memory cells.

Memory array 306 corresponds to at least a portion of a 3D crosspoint memory (e.g., that may include phase change memory cells or other suitable memory cells) and includes a plurality of word lines 315, a plurality of bit lines 317 and a plurality of memory cells, e.g., memory cells 307. Each memory cell is coupled between a word line ("WL") and a bit line ("BL") at a crosspoint of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 306 may be configured to store binary data and may be written to (i.e., programmed) or read from.

Memory partition controller 310 may manage communications with chip controller 126/226 and/or storage device controller 118/218. In a particular embodiment, memory partition controller 310 may analyze one or more signals received from another controller to determine whether a command sent via a bus is to be consumed by the memory partition 122/222. For example, controller 310 may analyze an address of the command and/or a value on an enable signal line to determine whether the command applies to the memory partition 122/222. Controller 310 may be configured to identify one or more target WLs and/or BLs associated with a received memory address (this memory address may be a separate address from the memory partition address that identifies the memory partition 122/222, although in some embodiments a portion of an address field of a command may identify the memory partition while another portion of the address field may identify one or more WLs and/or BLs). Memory partition controller 310 may be configured to manage operations of WL control logic 314 and BL control logic 316 based, at least in part, on WL and/or BL identifiers included in a received command.

WL control logic 314 includes WL switch circuitry 320 and sense circuitry 322. WL control logic 314 is configured to receive target WL address(es) from memory partition controller 310 and to select one or more WLs for reading and/or writing operations. For example, WL control logic 314 may be configured to select a target WL by coupling a WL select bias voltage to the target WL. WL control logic 314 may be configured to deselect a WL by decoupling the target WL from the WL select bias voltage and/or by coupling a WL deselect bias voltage to the WL. WL control logic 314 may be coupled to a plurality of WLs 315 included in memory array 306. Each WL may be coupled to a number of memory cells corresponding to a number of BLs 317. WL switch circuitry 320 may include a plurality of switches, each switch configured to couple (or decouple) a respective WL, e.g., WL 315A, to WL select bias voltage to select the respective WL 315A. For example, switch circuitry 320 may include a plurality of transistors.

BL control logic 316 includes BL switch circuitry 324. In some embodiments, BL control logic 316 may also include sense circuitry, e.g., sense circuitry 322. BL control logic 316 is configured to select one or more BLs for reading and/or writing operations. BL control logic 316 may be configured to select a target BL by coupling a BL select bias voltage to the target BL. BL control logic 316 may be configured to deselect a BL by decoupling the target BL from the BL select bias voltage and/or by coupling a BL deselect bias voltage to the BL. BL switch circuitry 324 is similar to WL switch circuitry 320 except BL switch circuitry 324 is configured to couple the BL select bias voltage to a target BL.

Sense circuitry 322 is configured to detect the state of one or more sensed memory cells 307 (e.g., via the presence or absence of a snap back event during a sense interval), e.g., during a read operation. Sense circuitry 322 is configured to provide a logic level output related to the result of the read operation to, e.g., memory partition controller 310. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 310, WL control logic 314 and BL control logic 316 may be configured to select one or more target memory cells, e.g., memory cell 307, for a read operation by coupling WL 315A to WL select bias voltage and BL 317A to BL select bias voltage. One or both of sense circuitries 322 may then be configured to monitor WL 315A and/or BL 317A for a sensing interval in order to determine the state of the memory cell 307A (e.g., to determine whether or not a snap back event occurs). For example, if a sense circuitry 322 detects a snap back event, then memory cell 307A may be in the set state, but if a sense circuitry 322 does not detect a snap back event in the sensing interval, then memory cell 307A may be in the reset state.

Thus, WL control logic 314 and/or BL control logic 316 may be configured to select a target memory cell for a read operation, initiate the read operation, sense the selected memory cell (e.g., for a snap back event) in a sensing interval, and provide the result of the sensing to, e.g., memory partition controller 310.

In a particular embodiment, the sense circuitry 322 may include a word-line load connected to a word-line electrode to provide a current on the word-line electrode as a first input to a current comparator (i.e., sense amp) of the sense circuitry. An equivalent word-line load may be connected to a reference current as a second input to the current comparator. The reference current may be selected such that the current of the target memory cell is lower than the reference current before snapback of the target memory cell and higher than the reference current after snapback of the target memory cell. In this manner, an output of the current comparator may be indicative of a state of the target memory cell. A latch may be coupled to the output of the current comparator to store the output of the read operation. In some embodiments, leakage components of the current can be mitigated by respectively selecting a bias for all other unselected word-lines and bit-lines that reduces or minimizes leakage. Capacitive components of the current can be mitigated by allowing sufficient time for the capacitive components to dissipate.

Figure 4:
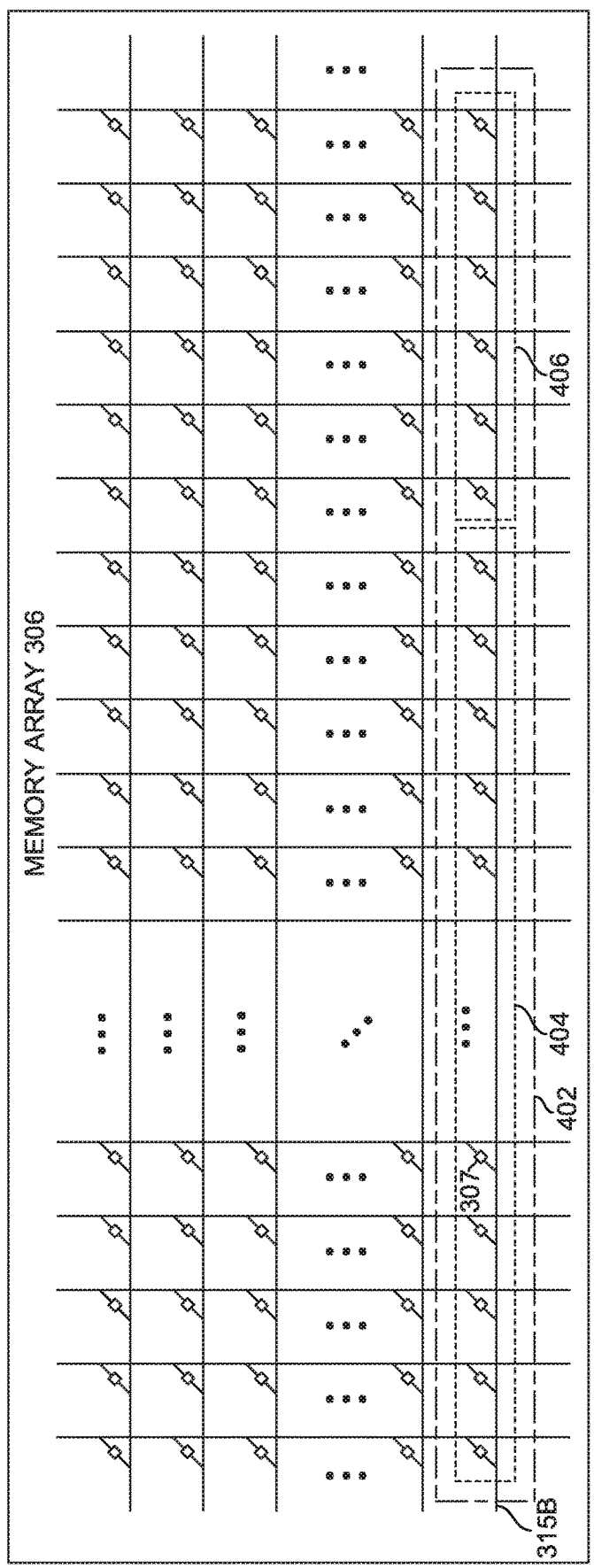
FIG. 4 illustrates a memory array in accordance with certain embodiments.

FIG. 4 illustrates a detailed exemplary view of the memory array 306 of FIG. 3 in accordance with certain embodiments. In various embodiments, a plurality of memory cells 307 of memory array 306 may be divided into a logical group such as a slice 402 (and the memory array 306 may include a plurality of slices). In the embodiment depicted, slice 402 includes a plurality of memory cells 307 coupled to the same WL 315A, though a slice 402 may comprise any suitable arrangement of memory cells.

In a particular embodiment, a slice may include a payload portion 404 and a metadata portion 406. The memory cells of the payload portion 404 may store data written to the storage device 106/206 by a host (e.g., CPU 102/104). For example, the host may send a write command specifying payload data to be written to the storage device 106/206 at a particular logical address. The payload of the write command may be stored in a payload portion 404 of one or more slices 402 (in various embodiments, the payload portion 404 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 406 of a slice 402 may store metadata associated with the payload data stored in the payload portion 404 of the slice 402 or the slice itself. The metadata portion 406 may store any suitable metadata associated with the payload data or slice. For example, the metadata portion 406 may store parity bits and/or cyclic redundancy check (CRC) bits used during error detection and error correction, e.g., by the storage device controller 118/218. In alternative embodiments, error detection and/or correction may be performed at any suitable level on the storage device 106/206, such as by the chip controllers 126/226 or partition controllers 310.

Figure 5:
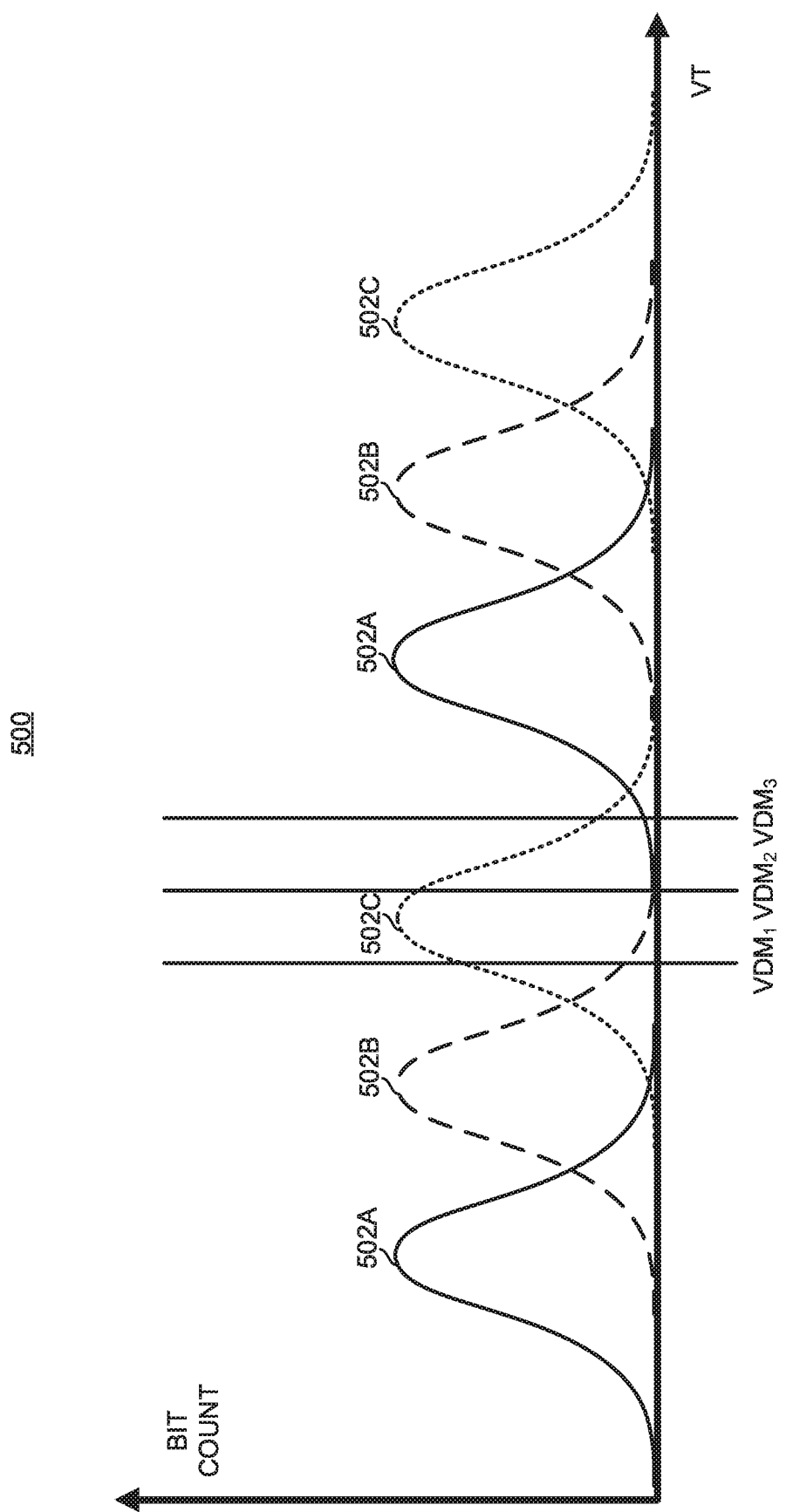
FIG. 5 illustrates a graph depicting memory cell threshold voltage distributions and demarcation voltages in accordance with certain embodiments.

FIG. 5 illustrates a graph 500 depicting memory cell threshold voltage distributions 502 (i.e., 502A-C) and demarcation voltages VDM1, VDM2, and VDM3 in accordance with certain embodiments. The horizontal axis depicts threshold voltages of memory cells of an array and the vertical axis depicts bit counts (i.e., number of memory cells). Thus, each point of a distribution 502 represents a number of cells having a particular threshold voltage. The graph 500 assumes that half of the bits of the array are in a set state (i.e., have a threshold voltage lower than the corresponding VDM) and half of the bits are in a reset state (i.e., have a threshold voltage higher than the corresponding VDM).

Distribution 502A represents a baseline distribution that may correspond to a threshold voltage distribution at a particular point in time (e.g., at the time immediately following a write or read operation performed on the memory cells). Distribution 502B may represent a distribution of the threshold voltages of the cells after a first amount of time has passed without the cells being accessed via a read or write operation. Distribution 502C may represent a distribution after an additional time has passed without the cells being accessed. As the amount of time without cells being accessed increased, the distributions of the threshold voltages of the cells shift to the right.

The VDMs depicted represent a series of VDM values that may be applied during a read operation. During the read operation, VDM1 may be applied and the cells may be sensed. If the sensing operation is unsuccessful (e.g., because too many errors were detected), the VDM may be stepped up (to VDM2) and the sensing operation may be repeated. Any number of VDMs may be applied during a read operation.

Debugging current storage devices and current memory chips within storage devices presents debugging issues. Debugging storage devices and their associated memory chips is facilitated by having access to commands and associated addresses in order to be able to determine under test which commands and associated addresses may have resulted in read errors. However, in current storage devices and associated memory chips, commands and associated addresses are embedded in the storage devices are generated and implemented very rapidly. It is therefore difficult to obtain an accurate history of the commands and addresses for read and write operations to a memory chip in order to determine, once read data is known to have presented a read error, how the read error was caused. For example, among a host of reasons that may have contributed to a read error, it may have been possible that the wrong data may have been written to the part of the memory that produced the read error, or, it may have been possible that a part of the memory chip may have had a design shortcoming where a write command to one area of the memory chip followed by a write command in another area of the memory chip may have presented a write address combination that may have created the read error. Therefore, having access to command and associated address information with respect to a given memory chip would present a useful manner of debugging read errors.

Some current solutions involve system level (that is, storage device level) firmware or hardware solutions to keep track of storage device logs. Such solutions require each storage device to have its own unique debugging solution depending on the storage device's configuration including number and type of memory chips. A few variations on current solutions involve the storing of written or read data. However, the data in itself will not provide insight into causes for read errors as would commands and associated addresses, and would still be on a storage device level. In addition, some current solutions include bus or logic analyzers to record a log on a die/chip of interest. However, the latter solutions disadvantageously do not allow access to certain dies/chips on the storage device that may be physically not reachable.

Some embodiments provide a method to log memory (e.g. read and write) commands and associated addresses in a memory circuitry, such as a dedicated SRAM, to allow debugging of the storage device including debugging of memory chips thereof. The method may provide for the logging of a maximum number of memory commands and associated addresses, the maximum number based for example on a size of the dedicated SRAM and/or on a preset/predetermined maximum value of a clock counter corresponding to the read and write commands and associated addresses. The method may further provide for logging of memory commands and associated addresses on a rolling basis, that is, for logging memory commands and associated addresses such that, once the maximum number has been logged within the dedicated SRAM, the SRAM is cleared, the SRAM address is set back to zero, and a logging of a next set of memory commands and associated addresses is implemented until the maximum number has been logged again, at which time the cycle of logging and setting of the SRAM address to zero is repeated. The read and write commands may be host-initiated or device-initiated read and write commands, that is, the at least one of the read and write commands may be initiated by the host, such as CPU 102/202, storage device controller 118/218 or chip controller 126/226 as shown by way of example in FIG. 1/2. The read and write commands correspond to the associated addresses (memory addresses) with which they are to be stored, such as in a command plus address pair. The debugging may include causing the storage device to enter a test mode, and causing the log to be made available to a user (i.e. a human or a machine) to implement debugging of the storage device. The debugging may include debugging at at least one of the storage device level, the memory chip level or the partition level.

Embodiments advantageously allow the storing of information on memory command and associated addresses (i.e. the storing of at least one of read or write command and its associated address in the memory chips of the storage device) in a dedicated SRAM at at least one of the system level (i.e.: storage device level) or the memory chip level of a storage device. The dedicated SRAM may include a storage device debug SRAM 245 of FIG. 2 or one or more chip debug SRAMs 235 of FIG. 2.

Referring again to FIG. 2, the shown embodiment may encompass both a dedicated SRAM 245 at the storage device level for the storage device 206, and a dedicated SRAM 235 at the memory chip level 216 as shown in FIG. 2 in broken lines. Embodiments encompass the use of either of SRAM 245 or SRAMs 235, or of both SRAM 245 and SRAMs 235, or even the provision of a single dedicated SRAM 235 at one of the partitions 222 without any other dedicated debug SRAMs in the storage device 206. Logic to cause the the logging of memory commands and associated addresses into the SRAMs 235/245 (logging logic) according to any of the preceding embodiments may be included in at least one of the program control logic 224, the chip controller 226, or the I/O controller 210 of computer system 200.

Embodiments advantageously make possible a fast and reliable debugging of storage devices by providing a log of memory commands and associated addresses in memory circuitry, such as in one or more dedicated SRAMs, to allow ready access to the log. Although embodiments encompass the logging of memory commands and associated addresses in any type of memory circuitry, including an SRAM, such as a dedicated SRAM, the description below will refer to one or more dedicated SRAMs, although it is to be understood that embodiments are not so limited, and are to encompass any type of memory circuitry, which memory could include the existing SRAMs in the storage device (such as SRAMs 130 and/or 128), or dedicated SRAMs such as SRAMs 235 and 245.

Some embodiments involving the use of a dedicated chip debug SRAM such as chip debug SRAMs 235 of FIG. 2 are advantageously storage device agnostic, in that they allow the debugging of storage devices without the need to tailor the debugging solution to a particular storage device. The provision of a dedicated chip debug SRAM and associated firmware within a memory chip to allow the logging of memory commands and associated addresses advantageously allows debugging of a storage device on a per memory chip basis without the need to tailor logging solutions as a function of the number and type of memory chips provided on that storage device, since, according to some embodiments, each memory chip may come equipped with its own debugging solution and the debugging solution is therefore only chip-dependent and agnostic to the storage device that is to house the memory chip. Embodiments advantageously allow debugging for example at a design stage of a memory chip or storage device, and/or at a design stage of a tailored computer system to incorporate a memory chip or storage device, by providing a user access to information regarding the logged memory.

The dedicated SRAMs 235 and/or 245 may have known SRAM configurations as would be within the knowledge of a skilled person. The logic to cause the logging within any of the dedicated SRAMs may be soft-coded or hard-coded into at least one of the program control logic 224, the chip controller 226, or the I/O controller 210 of computer system 200, or, the logic may be soft-coded or hard-coded in dedicated control circuitry (not shown) that may be coupled to one or more of the dedicated SRAMs. Embodiments may for example be implemented in a complementary metal oxide semiconductor (CMOS) circuit containing combinational logic and an SRAM. The logic may include algorithm to use any of the dedicated SRAMs specifically to store the memory commands and associated addresses, for example as will be specified in further detail below.

During operation, when a read command from the host such as CPU 202 generates erroneous read data and therefore a memory read failure at the host, the host may halt further commands, such as further memory commands, to determine the source of the read failure, and cause the storage device 206, to enter a test mode so as to allow a debugging and a determination of a source of the erroneous read data. The host may cause the storage device 206 to enter a test mode for example by generating and sending a trigger signal to the storage device 206 to trigger the test mode.

When a read error takes place by virtue of execution of a read command by the storage device controller 218 and associated chip controller 226, error detection logic on the storage device 206, such as the storage device controller 218, may detect encountered errors during memory operations, such as via an error correction code (ECC engine). Such error detection logic may cause a signaling of the detection of a read error to the host, such as to CPU 202. The error detection logic may use metadata or parity data that is part of the read data in order to detect an error. The error detection logic on the storage device controller 218 may not have information regarding the source memory chip from the large number of memory chips from the which the wrong data was read, but would be able to detect the fact of the read data being erroneous.

An advantage of some embodiments would arise from the ready availability of information regarding commands and associated addresses that may pertain to the error in the read data in order to be able to pinpoint one or more reasons behind the error in a debugging operation by a user.

Once in a test mode as noted above, the host may issue a debug read command to cause a read of the information in the dedicated SRAM on the stored memory commands and associated addresses according to some embodiments. The information may be signaled by way corresponding pins of the dedicated SRAM, such as DQ pins used for data input and output. After the host causes a read of the information on the memory commands and associated addresses stored in one or more dedicated SRAMs, the host may cause the information to be provided to a user, such as to a user by way of a display peripheral device coupled to the host through the external I/O controller 204, to a user including processor 208 or another processor for further processing such as for implementing a machine learning operation to learn and predict error generations and to allow debugging in memory operations, and/or the host may cause the information to be stored on a file anywhere on the computer system 200, such as in a NVM.

Table 1 is an example of information that the host may extract from a dedicated SRAM on a storage device and provide to a user according to some embodiments:

TABLE 1

| SRAM_Address | Clock_Count | Command | Address |
|---|---|---|---|
| 0 | 8 | Write | 0xFF01 |
| 1 | 8 | Write | 0xFF01 |
| 2 | 8 | Write | 0xFF01 |
| 3 | 8 | Write | 0xFF01 |
| 4 | 8 | Write | 0xFF01 |
| 5 | 8 | Write | 0xFF01 |
| . . . | . . . | . . . | . . . |
| 27 | 8 | Write | 0xFF01 |
| 28 | 10 | Read | 0xFF00 |
| 29 | 8 | Write | 0xFF01 |
| 30 | 8 | Write | 0xFF01 |
| 31 | 8 | Write | 0xFF01 |

In the example of Table 1, 32 pairs of memory command and associated memory addresses (memory command and associated address pairs) are shown to have been caused by a controller (such as storage device controller 218 or chip controller 226 of each memory chip) to be logged/stored in a dedicated SRAM (such as SRAM 235 or SRAM 245 of FIG. 2), read by the host such as CPU 202 and provided to the user. It is possible to see at command 29, corresponding to dedicated SRAM address 28, that at clock count 10, a read command was given that resulted in a read from memory address 0xFF00.

Referring still to Table 1, if the storage device 206 flagged a read error to CPU 202 with respect to the command 29 at dedicated SRAM address 28, that is, if the command 29, logged at dedicated SRAM address 28, resulted in the read failure as signaled to the host by the storage device controller 218, the host may stop any further commands after the signaling of the read failure, cause the computer system to be placed in a test mode, and issue a debug read command to cause a read of the information in the dedicated SRAM on the stored memory commands and associated addresses according to some embodiments. The information may be signaled by way corresponding pins of the dedicated SRAM, such as DQ pins used for data input and output, and may correspond to the information shown in Table 1. After the host causes a read of the information on the memory commands and associated addresses stored in one or more dedicated SRAMs, the host may cause the information to be provided to a user, such as to a user by way of a display peripheral device coupled to the host through the external I/O controller 204, to a user including processor 208 or another processor for further processing such as for implementing a machine learning operation to learn and predict error generations and to allow debugging in memory operations, and/or the host may cause the information to be stored on a file anywhere on the computer system 200, such as in a NVM.

Information, such as information shown by way of example in Table 1, depending on the number of commands and associated addresses provided, may allow a user to implement memory debugging for example by analyzing the commands and associated addresses stored in the one or more dedicated SRAMS to determine any patterns in the commands and/or associated addresses or other clues that may explain the erroneous read.

Figure 6:
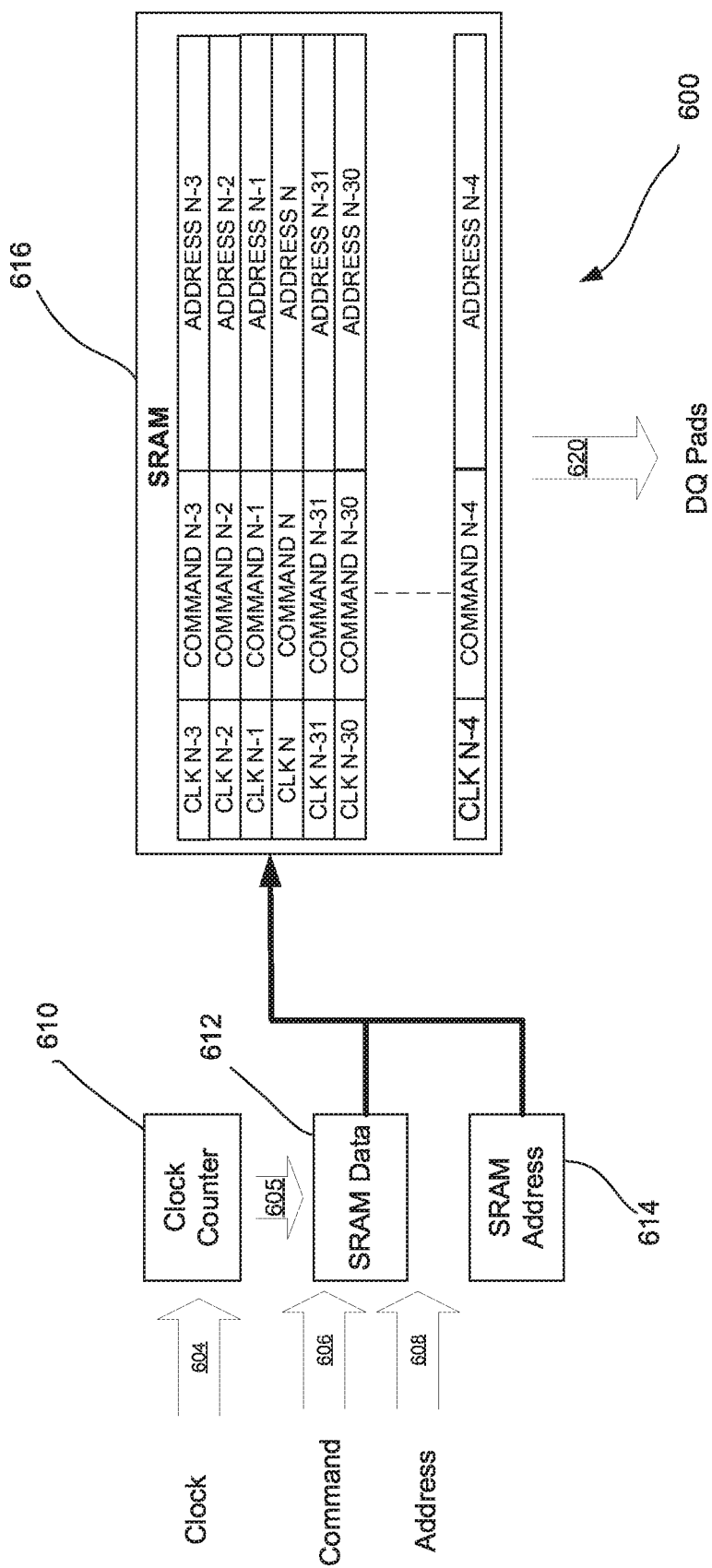
FIG. 6 illustrates a flow to store memory commands and associated addresses in a dedicated SRAM according to some embodiments.

Reference is now made to FIG. 6, which shows a flow 600 according to one embodiment for logging memory commands 606 and associated addresses 608 in the form of SRAM data 612 into a dedicated SRAM 616, which may correspond to either a storage device SRAM such as dedicated SRAM 245, or a memory chip dedicated SRAM such as SRAM 235 of FIG. 2. SRAM 616 of FIG. 6 is a 32 entry SRAM by way of example. The flow 600 of FIG. 6 may for example be implemented by logging logic within storage device controller 228 where SRAM 616 corresponds to dedicated SRAM 245, and within chip controller 226 where SRAM 616 corresponds to dedicated SRAM 235. A dedicated SRAM according to embodiments may have a size between about 16 to 256 entries or more (corresponding for example to 16 to 256 SRAM lines of addresses, or more), with the shown dedicated SRAM size in FIG. 6 corresponding to 32 entries by way of example only. The dedicated SRAM size for each line may be from about 4 bits to about 128 bits wide or more, with a maximum dedicated SRAM size therefore being 256 entries long and 128 bits wide, or even larger.

Referring still to FIG. 6, a clock counter logic 610 may be implemented as part of the logic to log the commands and associated addresses according to embodiments. The clock counter logic 610 may receive clock signals 604, such as from storage device controller 218 or from chip controller 226, to generate a clock entry 605. The clock entry 605 is based on a number of clock counts between a last and current memory command. Clock counter 610 provides a measure of time between commands. Memory commands that rapidly succeed one another might need less time and hence less clock counts in order to fill each of the SRAM fields up to the 32 entries of SRAM 616. However, memory commands that succeed each other at a slow pace may need more time and hence more clock counts in order to fill the 32 entries of SRAM 616. As a result, some embodiments may set a maximum time value or maximum number of clock counts or maximum clock counter value for the clock counter beyond which the clock counter is to stop generating clock entries 605 for the logging of clock counts, commands and associated addresses. The maximum clock count may be dependent on the size of the SRAM 616, including a number of bits of each line of the SRAM 616. By way of example, a maximum clock count per line of 128 bits may be 50. The maximum clock count may further be selected based on the size of the dedicated SRAM, especially given that the larger the clock count, the higher the number of bits necessary in each SRAM entry or field to accommodate storing the clock entry for the clock count. For example, for a clock at a maximum clock count of 1024, 10 bits may be required in each SRAM entry or field.

Referring still to FIG. 6, memory command data 606 and address command data 608 generated by the SRAM Address block 614 may be aggregated or combined along with the clock entry 605 in the SRAM Data block 612 and provided to the SRAM 616 to populate the fields of the SRAM 616 as shown.

In operation, at power up, logging logic may clear SRAM 616 and set the SRAM address to zero. Thereafter, clock entry, memory command and associated address information may be combined by the SRAM Data block 612 on a per memory command basis and logged into the SRAM 616 in a preset maximum number of entries including a first set of clock entries, memory commands and associated addresses up to a maximum storage size of the SRAM (with the preset maximum number of entries being dependent on the storage size of the SRAM). After the maximum storage capacity of the SRAM has been reached, the SRAM Address block 614 resets the SRAM address back to zero, and the logging begins again for the next/subsequent set of 32 entries of data relating to clock entry, memory command and associated address information. Thus, the logging may, according to some embodiments, be on a rolling basis. Upon detection of a memory read failure, a debug read command, for example from a host, may be implemented on the SRAM 616 to read the information stored in SRAM 616 for debugging purposes, for example by way of DQ pads 620.

Some embodiments include, in addition to storing clock entry, memory command and associated address information, additionally storing data unrelated to memory commands in the dedicated SRAM, for example by adding another field in the dedicated SRAM, which may triple or quadruple the desired size of the dedicated SRAM. The data thus stored may for example include the data that was the subject of the memory commands for reading from or writing to the memory arrays of the storage device.

Figure 7:
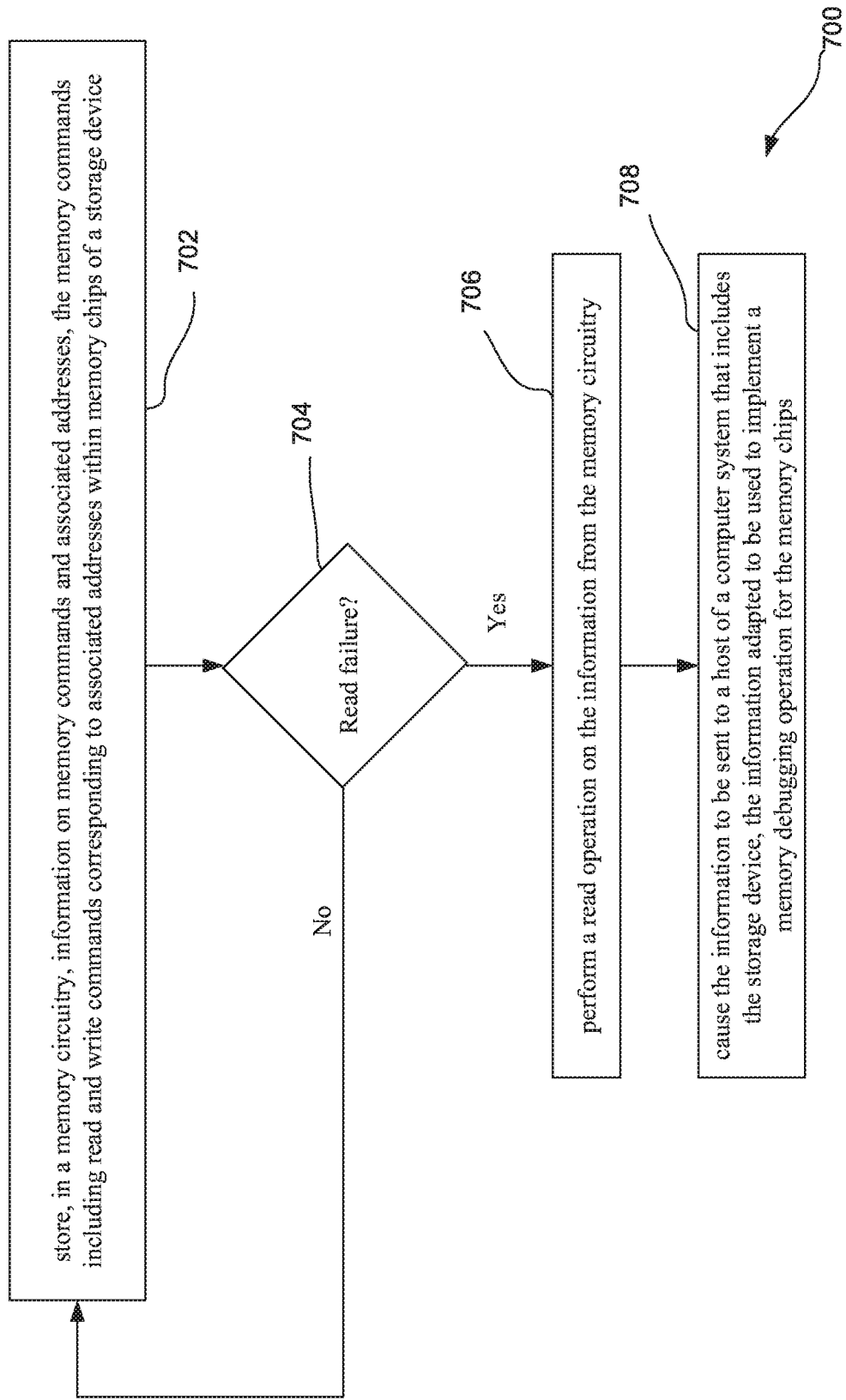
FIG. 7 illustrates an example process for logging commands and associated addresses for a memory debug operation in accordance with certain embodiments.

FIG. 7 illustrates an example of a process 700 according to some embodiments. The process includes, at operation 702, storing, in a memory circuitry, information on memory commands and associated addresses, the memory commands including read and write commands corresponding to associated addresses within memory chips of a storage device; at operation 704, the process includes a determination as to whether a read failure has taken place, and if no, the process returns to operation 702, and if yes, the process proceeds to operation 706; at operation 706, the process includes performing a read operation on the information from the memory circuitry; and at operation 708, the process includes causing the information to be sent to a host of a computer system that includes the storage device, the information adapted to be used to implement a memory debugging operation for the memory chips.

The flow described in FIG. 7 is merely representative of operations that may occur in particular embodiments. In other embodiments, additional operations may be performed by the components of system 200. Various embodiments of the present disclosure contemplate any suitable signaling mechanisms for accomplishing the functions described herein. Some of the operations illustrated in FIG. 7 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102/202, external I/O controller 104/204, processor 108/208, cores 114A/214A and 114B/214B, I/O controller 110/210, CPU memory controller 112/212, storage device 106/206, system memory device 107/207, memory chip 116/216, storage device controller 118/218, address translation engine 120/220, memory partition 122/222, program control logic 124/224, chip controller 126/226, memory array 306, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes an apparatus comprising: memory circuitry to store memory commands and associated addresses, the memory commands including read and write commands corresponding to associated addresses within memory chips of a storage device; and a controller coupled to the memory circuitry to: cause information on the memory commands and associated addresses to be logged in the memory circuitry; in response to a determination of a read failure corresponding to at least one of the memory commands: perform a read operation on the information from the memory circuitry; and cause the information to be sent to a host of a computer system that includes the storage device, the information adapted to be used to implement a memory debugging operation for the memory chips.

Example 2 includes the subject matter of Example 1, and optionally, wherein the controller is cause the information to be stored on a rolling basis by: causing a preset maximum number of a first set of the memory commands and associated addresses to be stored in the memory circuitry based on a storage capacity of the memory circuitry; in response to a determination that the storage capacity has been reached, causing the preset maximum number of a subsequent set of the memory commands and associated addressed to be stored in the memory circuitry based on the storage capacity of the memory circuitry; and repeating causing the preset maximum number of a subsequent set of the memory commands and associated addressed to be stored until the controller is powered off.

Example 3 includes the subject matter of Example 1, and optionally, wherein the memory circuitry comprises at least one of: a dedicated static random access memory (SRAM) circuitry of the storage device; or respective dedicated SRAM circuitries of the memory chips, wherein each of the respective dedicated SRAM circuitries of the memory chips is to store memory commands and associated addresses for a corresponding memory chip thereof.

Example 4 includes the subject matter of Example 1, and optionally, wherein the controller is part of at least one of: a storage device controller of the storage device; or respective chip controllers of respective ones of the memory chips, wherein each of the respective chip controllers is to: cause information to be logged in the memory circuitry on memory commands and associated addresses for a corresponding memory chip of the memory chips; in response to a determination of a read failure corresponding to at least one of the memory commands for the corresponding memory chip: perform a read operation from the memory circuitry on the information on memory commands and associated addresses for the corresponding memory chip;

and cause the information on memory commands and associated addresses for the corresponding memory chip to be sent to the host of the device.

Example 5 includes the subject matter of Example 1, and optionally, wherein the controller further including a clock counter, and is to cause the information on the memory commands and associated addresses to be logged in the memory circuitry based on a maximum clock counter value of the clock counter, the controller further to cause information on a clock entry of the clock counter corresponding to each memory command and associated address pair to be logged in the memory circuitry and to be provided to the host upon detection of a read failure.

Example 6 includes the subject matter of Example 1, and optionally, wherein the memory chips each include a three dimensional crosspoint memory array.

Example 7 includes the subject matter of Example 1, and optionally, wherein the controller is to receive a trigger signal from the host to enter a test mode in response to the determination of the read failure, and to enter the test mode before performing the read operation and before causing the information to be sent to the host.

Example 8 includes the subject matter of Example 1, and optionally, wherein the controller is to cause the information to be stored in a memory distinct from the memory circuitry.

Example 9 includes a computer system including: a host; and a storage device including a plurality of memory chips thereon and coupled to the host, the storage device further including: memory circuitry to store memory commands and associated addresses, the memory commands including read and write commands corresponding to associated addresses of the memory chips; and a controller coupled to the memory circuitry to: cause information on the memory commands and associated addresses to be logged in the memory circuitry; in response to a determination of a read failure corresponding to at least one of the memory commands, implement a read command from the host, perform a read operation on the information from the memory circuitry, and cause the information to be sent to the host; wherein the host is to, in response to the determination of the read failure: generate the read command, send the read command to the storage device, and receive the information from the storage device; and provide the information to a user for the user to implement a memory debugging operation on one or more of the memory chips of the storage device.

Example 10 includes the subject matter of Example 9, and optionally, wherein: the host is to, in response to the determination of the read failure, send a trigger signal to the storage device to cause the storage device to enter a test mode prior to sending the read command to the storage device; and the storage device is to enter a test mode in response to receiving the trigger signal prior to implementing the read command.

Example 11 includes the subject matter of Example 9, and optionally, wherein the host is to cause the information to be stored in a memory distinct from the memory circuitry.

Example 12 includes the subject matter of Example 9, and optionally, wherein the controller is cause the information to be stored on a rolling basis by: causing a preset maximum number of a first set of the memory commands and associated addresses to be stored in the memory circuitry based on a storage capacity of the memory circuitry; in response to a determination that the storage capacity has been reached, causing the preset maximum number of a subsequent set of the memory commands and associated addressed to be stored in the memory circuitry based on the storage capacity of the memory circuitry; and repeating causing the preset maximum number of a subsequent set of the memory commands and associated addressed to be stored until the controller is powered off.

Example 13 includes the subject matter of Example 9, and optionally, wherein the memory circuitry comprises at least one of: a dedicated static random access memory (SRAM) circuitry of the storage device; or respective dedicated SRAM circuitries of the memory chips, wherein each of the respective dedicated SRAM circuitries of the memory chips is to store memory commands and associated addresses for a corresponding memory chip thereof.

Example 14 includes the subject matter of Example 9, and optionally, wherein the controller is part of at least one of: a storage device controller of the storage device; or respective chip controllers of respective ones of the memory chips, wherein each of the respective chip controllers is to: cause information to be logged in the memory circuitry on memory commands and associated addresses for a corresponding memory chip of the memory chips; in response to a determination of a read failure corresponding to at least one of the memory commands for the corresponding memory chip: perform a read operation from the memory circuitry on the information on memory commands and associated addresses for the corresponding memory chip; and cause the information on memory commands and associated addresses for the corresponding memory chip to be sent to the host of the device.

Example 15 includes the subject matter of Example 9, and optionally, wherein the controller further including a clock counter, and is to cause the information on the memory commands and associated addresses to be logged in the memory circuitry based on a maximum clock counter value of the clock counter, the controller further to cause information on a clock entry of the clock counter corresponding to each memory command and associated address pair to be logged in the memory circuitry and to be provided to the host upon detection of a read failure.

Example 16 includes the subject matter of Example 9, and optionally, wherein the memory chips each include a three dimensional crosspoint memory array.

Example 17 includes the subject matter of Example 9, and optionally, wherein the controller is to receive a trigger signal from the host to enter a test mode in response to the determination of the read failure, and to enter the test mode before performing the read operation and before causing the information to be sent to the host.

Example 18 includes a method comprising: storing, in a memory circuitry, information on memory commands and associated addresses, the memory commands including read and write commands corresponding to associated addresses within memory chips of a storage device; in response to a determination of a read failure corresponding to at least one of the memory commands: performing a read operation on the information from the memory circuitry; and causing the information to be sent to a host of a device that includes the storage device, the information adapted to be used to implement a memory debugging operation for the memory chips.

Example 19 includes the subject matter of Example 18, and optionally, further including causing the information to be stored on a rolling basis by: causing a preset maximum number of a first set of the memory commands and associated addresses to be stored in the memory circuitry based on a storage capacity of the memory circuitry; in response to a determination that the storage capacity has been reached, causing the preset maximum number of a subsequent set of the memory commands and associated addressed to be stored in the memory circuitry based on the storage capacity of the memory circuitry; and repeating causing the preset maximum number of a subsequent set of the memory commands and associated addressed to be stored until the memory circuitry is powered off.

Example 20 includes the subject matter of Example 18, and optionally, wherein the memory circuitry comprises at least one of: a dedicated static random access memory (SRAM) circuitry of the storage device; or respective dedicated SRAM circuitries of the memory chips, wherein each of the respective dedicated SRAM circuitries of the memory chips is to store memory commands and associated addresses for a corresponding memory chip thereof.

Example 21 includes the subject matter of Example 18, and optionally, wherein causing includes causing the information on the memory commands and associated addresses to be logged in the memory circuitry based on a maximum clock counter value of a clock counter, the method further including causing information on a clock entry of the clock counter corresponding to each memory command and associated address pair to be logged in the memory circuitry and to be provided to the host upon detection of a read failure.

Example 22 includes the subject matter of Example 18, and optionally, wherein the memory chips each include a three dimensional crosspoint memory array.

Example 23 includes the subject matter of Example 18, and optionally, further including receiving a trigger signal from the host to enter a test mode in response to the determination of the read failure, and entering the test mode before performing the read operation and before causing the information to be sent to the host.

Example 24 includes the subject matter of Example 18, and optionally, further including causing the information to be stored in a memory distinct from the memory circuitry.

Example 25 includes a non-transitory machine readable storage medium having instructions stored thereon, the instructions when executed by a machine to cause the machine to: in response to a determination of a memory read failure from an implementation of a read command by a storage device: generate a debug read command to read a log of memory commands and associated addresses, the memory commands including the read command and further including read and write commands corresponding to associated addresses within memory chips of the storage device; send the debug read command to the storage device; receive information on the log from the storage device; and provide the information to a user for the user to implement a memory debugging operation on one or more of the memory chips.

Example 26 includes the subject matter of Example 25, and optionally, wherein the instructions are to cause the machine to, in response to the determination of the memory read failure, send a trigger signal to the storage device to cause the storage device to enter a test mode prior to sending the read command to the storage device.

Example 27 includes the subject matter of Example 25, and optionally, wherein the instructions are to cause the machine to cause the information to be stored in a memory distinct from memory circuitry storing the log.

Example 28 includes a non-transitory machine readable storage medium having instructions stored thereon, the instructions when executed by a machine to cause the machine to: store, in a memory circuitry, information on memory commands and associated addresses, the memory commands including read and write commands corresponding to associated addresses within memory chips of a storage device; in response to a determination of a read failure corresponding to at least one of the memory commands: perform a read operation on the information from the memory circuitry; and cause the information to be sent to a host of a device that includes the storage device, the information adapted to be used to implement a memory debugging operation for the memory chips.

Example 29 includes the subject matter of Example 28, and optionally, the instructions to further cause the machine to store the information on a rolling basis by: causing a preset maximum number of a first set of the memory commands and associated addresses to be stored in the memory circuitry based on a storage capacity of the memory circuitry; in response to a determination that the storage capacity has been reached, causing the preset maximum number of a subsequent set of the memory commands and associated addressed to be stored in the memory circuitry based on the storage capacity of the memory circuitry; and repeating causing the preset maximum number of a subsequent set of the memory commands and associated addressed to be stored until the memory circuitry is powered off.

Example 30 includes the subject matter of Example 28, and optionally, wherein the memory circuitry comprises at least one of: a dedicated static random access memory (SRAM) circuitry of the storage device; or respective dedicated SRAM circuitries of the memory chips, wherein each of the respective dedicated SRAM circuitries of the memory chips is to store memory commands and associated addresses for a corresponding memory chip thereof.

Example 31 includes the subject matter of Example 28, and optionally, wherein the instructions are to further cause the machine to store the information on the memory commands and associated addresses in the memory circuitry based on a maximum clock counter value of a clock counter, the instructions to further cause the machine to store information on a clock entry of the clock counter corresponding to each memory command and associated address pair in the memory circuitry and to be provided to the host upon detection of a read failure.

Example 32 includes the subject matter of Example 28, and optionally, wherein the memory chips each include a three dimensional crosspoint memory array.

Example 33 includes the subject matter of Example 28, and optionally, wherein the instructions are to further cause the machine to receive a trigger signal from the host to enter a test mode in response to the determination of the read failure, and to enter the test mode before performing the read operation and before causing the information to be sent to the host.

Example 34 includes the subject matter of Example 28, and optionally, wherein the instructions are to further cause the machine to cause storing of the information in a memory distinct from the memory circuitry.

Example 35 includes an apparatus comprising means to perform one or more elements of a method described in or related to any of the Examples above, or any other method or process described herein.

Example 36 includes one or more non-transitory computer-readable media comprising instructions to cause an electronic device, upon execution of the instructions by one or more processors of the electronic device, to perform one or more elements of a method described in or related to any of the Examples above, or any other method or process described herein.

Example 37 includes an apparatus comprising logic, modules, or circuitry to perform one or more elements of a method described in or related to any of the Examples above, or any other method or process described herein.

Example 38 includes a method, technique, or process as described in or related to any of the Examples above, or portions or parts thereof.

Example 39 includes an apparatus comprising: one or more processors and one or more computer-readable media comprising instructions that, when executed by the one or more processors, cause the one or more processors to perform the method, techniques, or process as described in or related to any of the Examples above, or portions thereof.

Example 40 includes a signal as described in or related to any of the Examples above, or portions or parts thereof.

Example 41 includes a datagram, packet, frame, segment, protocol data unit (PDU), or message as described in or related to any of the Examples above, or portions or parts thereof, or otherwise described in the present disclosure.

Example 42 includes a signal encoded with data as described in or related to any of the Examples above, or portions or parts thereof, or otherwise described in the present disclosure.

Example 43 includes a signal encoded with a datagram, packet, frame, segment, protocol data unit (PDU), or message as described in or related to any of the Examples above, or portions or parts thereof, or otherwise described in the present disclosure.

Example 44 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 45 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   memory circuitry to store memory commands and associated addresses, the memory commands including read and write commands corresponding to associated addresses within memory chips of a storage device; and
   a controller coupled to the memory circuitry to:
      cause information on the memory commands and associated addresses to be logged in the memory circuitry;
      in response to a determination of a read failure corresponding to at least one of the memory commands:
         perform a read operation on the information from the memory circuitry;
         cause the information to be sent to a host of a computer system that includes the storage device, the information adapted to be used to implement a memory debugging operation for the memory chips; and
      receive a trigger signal from the host to enter a test mode in response to the determination of the read failure, and enter the test mode before performing the read operation and before causing the information to be sent to the host.

2. The apparatus of claim 1, wherein the controller is to cause the information to be stored on a rolling basis by:
   causing a preset maximum number of a first set of the memory commands and associated addresses to be stored in the memory circuitry based on a storage capacity of the memory circuitry;
   in response to a determination that the storage capacity has been reached, causing the preset maximum number of a subsequent set of the memory commands and associated addresses to be stored in the memory circuitry based on the storage capacity of the memory circuitry; and
   repeating causing the preset maximum number of a subsequent set of the memory commands and associated addresses to be stored until the controller is powered off.

3. The apparatus of claim 1, wherein the memory circuitry comprises at least one of:
   a dedicated static random access memory (SRAM) circuitry of the storage device; or
   respective dedicated SRAM circuitries of the memory chips, wherein each of the respective dedicated SRAM circuitries of the memory chips is to store memory commands and associated addresses for a corresponding memory chip thereof.

4. The apparatus of claim 1, wherein the controller is part of at least one of:
   a storage device controller of the storage device; or
   respective chip controllers of respective ones of the memory chips, wherein each of the respective chip controllers is to:
      cause information to be logged in the memory circuitry on memory commands and associated addresses for a corresponding memory chip of the memory chips;
      in response to a determination of a read failure corresponding to at least one of the memory commands for the corresponding memory chip:
         perform a read operation from the memory circuitry on the information on memory commands and associated addresses for the corresponding memory chip; and
         cause the information on memory commands and associated addresses for the corresponding memory chip to be sent to the host of the computer system.

5. The apparatus of claim 1, wherein the controller further including a clock counter, and is to cause the information on the memory commands and associated addresses to be logged in the memory circuitry based on a maximum clock counter value of the clock counter, the controller further to cause information on a clock entry of the clock counter corresponding to each memory command and associated address pair to be logged in the memory circuitry and to be provided to the host upon detection of a read failure.

6. The apparatus of claim 1, wherein the memory chips each include a three dimensional crosspoint memory array.

7. The apparatus of claim 1, wherein the controller is to cause the information to be stored in a memory distinct from the memory circuitry.

8. A computer system including:
a host; and
a storage device including a plurality of memory chips thereon and coupled to the host, the storage device further including:
   memory circuitry to store memory commands and associated addresses, the memory commands including read and write commands corresponding to associated addresses of the memory chips; and
   a controller coupled to the memory circuitry to:
      cause information on the memory commands and associated addresses to be logged in the memory circuitry;
      in response to a determination of a read failure corresponding to at least one of the memory commands, implement a read command from the host, perform a read operation on the information from the memory circuitry, and cause the information to be sent to the host; and
      receive a trigger signal from the host to enter a test mode in response to the determination of the read failure, and enter the test mode before performing the read operation and before causing the information to be sent to the host;
   wherein the host is to, in response to the determination of the read failure:
      send the trigger signal to the controller to enter the test mode;
      generate the read command, send the read command to the storage device, and receive the information from the storage device-; and
      provide the information to a user for the user to implement a memory debugging operation on one or more of the memory chips of the storage device.

9. The computer system of claim 8, wherein the host is to cause the information to be stored in a memory distinct from the memory circuitry.

10. A method comprising:
storing, in a memory circuitry, information on memory commands and associated addresses, the memory commands including read and write commands corresponding to associated addresses within memory chips of a storage device;
in response to a determination of a read failure corresponding to at least one of the memory commands:
   performing a read operation on the information from the memory circuitry;
   causing the information to be sent to a host of a computer system that includes the storage device, the information to be used to implement a memory debugging operation for the memory chips; and
   receiving a trigger signal from the host to enter a test mode in response to the determination of the read failure, and entering the test mode before performing the read operation and before causing the information to be sent to the host.

11. The method of claim 10, further including causing the information to be stored on a rolling basis by:
causing a preset maximum number of a first set of the memory commands and associated addresses to be stored in the memory circuitry based on a storage capacity of the memory circuitry;
in response to a determination that the storage capacity has been reached, causing the preset maximum number of a subsequent set of the memory commands and associated addresses to be stored in the memory circuitry based on the storage capacity of the memory circuitry; and
repeating causing the preset maximum number of a subsequent set of the memory commands and associated addresses to be stored until the memory circuitry is powered off.

12. The method of claim 10, wherein the memory circuitry comprises at least one of:
a dedicated static random access memory (SRAM) circuitry of the storage device; or
respective dedicated SRAM circuitries of the memory chips, wherein each of the respective dedicated SRAM circuitries of the memory chips is to store memory commands and associated addresses for a corresponding memory chip thereof.

13. The method of claim 10, wherein causing includes causing the information on the memory commands and associated addresses to be logged in the memory circuitry based on a maximum clock counter value of a clock counter, the method further including causing information on a clock entry of the clock counter corresponding to each memory command and associated address pair to be logged in the memory circuitry and to be provided to the host upon detection of a read failure.

14. A non-transitory machine readable storage medium having instructions stored thereon, the instructions when executed by a machine to cause the machine to:
store, in a memory circuitry, information on memory commands and associated addresses, the memory commands including read and write commands corresponding to associated addresses within memory chips of a storage device;
in response to a determination of a read failure corresponding to at least one of the memory commands:
   perform a read operation on the information from the memory circuitry;
   cause the information to be sent to a host of a computer system that includes the storage device, the information adapted to be used to implement a memory debugging operation for the memory chips; and
   receive a trigger signal from the host to enter a test mode in response to the determination of the read failure, and enter the test mode before performing the read operation and before causing the information to be sent to the host.

15. The machine readable storage medium of claim 14, the instructions to further cause the machine to store the information on a rolling basis by:
causing a preset maximum number of a first set of the memory commands and associated addresses to be stored in the memory circuitry based on a storage capacity of the memory circuitry;
in response to a determination that the storage capacity has been reached, causing the preset maximum number of a subsequent set of the memory commands and associated addresses to be stored in the memory circuitry based on the storage capacity of the memory circuitry; and repeating causing the preset maximum number of a subsequent set of the memory commands and associated addresses to be stored until the memory circuitry is powered off.

16. The machine readable storage medium of claim 14, wherein the memory circuitry comprises at least one of:
   a dedicated static random access memory (SRAM) circuitry of the storage device; or
   respective dedicated SRAM circuitries of the memory chips, wherein each of the respective dedicated SRAM circuitries of the memory chips is to store memory commands and associated addresses for a corresponding memory chip thereof.

17. The machine readable storage medium of claim 14, wherein the instructions are to further cause the machine to store the information on the memory commands and associated addresses in the memory circuitry based on a maximum clock counter value of a clock counter, the instructions to further cause the machine to store information on a clock entry of the clock counter corresponding to each memory command and associated address pair in the memory circuitry and to be provided to the host upon detection of a read failure.

18. The machine readable storage medium of claim 14, wherein the memory chips each include a three dimensional crosspoint memory array.

* * * * *